US012184287B2

(12) United States Patent
Wang

(10) Patent No.: US 12,184,287 B2
(45) Date of Patent: Dec. 31, 2024

(54) FREQUENCY-DETECTING CIRCUIT, DUTY-CYCLE CORRECTOR, AND ELECTRONIC DEVICE

(71) Applicant: GigaDevice Semiconductor Inc., Beijing (CN)

(72) Inventor: Menghai Wang, Beijing (CN)

(73) Assignee: GigaDevice Semiconductor Inc., Beijing (CN)

( * ) Notice: Subject to any disclaimer, the term of this patent is extended or adjusted under 35 U.S.C. 154(b) by 155 days.

(21) Appl. No.: 18/080,746

(22) Filed: Dec. 14, 2022

(65) Prior Publication Data

US 2023/0387890 A1 Nov. 30, 2023

(30) Foreign Application Priority Data

May 25, 2022 (CN) ........................ 202210580300.6
May 25, 2022 (CN) ........................ 202210584059.4

(51) Int. Cl.

*H03K 3/017* (2006.01)
*G01R 31/317* (2006.01)
*H03K 17/687* (2006.01)
*H03K 19/20* (2006.01)

(52) U.S. Cl.

CPC ....... *H03K 3/017* (2013.01); *G01R 31/31727* (2013.01); *H03K 17/6872* (2013.01); *H03K 19/20* (2013.01)

(58) Field of Classification Search

CPC .... H03K 3/017; H03K 17/6872; H03K 19/20; H03K 5/1565; G01R 31/31727
USPC .......................................................... 327/175
See application file for complete search history.

(56) References Cited

U.S. PATENT DOCUMENTS 7,019,571 B2 * 3/2006 Lim ........................ H03L 7/093 327/156
9,559,707 B2 * 1/2017 Luo ........................ H03L 7/089
11,481,072 B2 * 10/2022 Fan ...................... H03K 17/962
11,722,140 B2 * 8/2023 Lu ........................ H03L 7/0893 327/156
2002/0075050 A1 6/2002 Ma et al.
2005/0180066 A1 * 8/2005 Hamaguchi ...... G11B 20/10222 361/18

(Continued)

FOREIGN PATENT DOCUMENTS

WO 2011036516 A1 3/2011

OTHER PUBLICATIONS

European Search Report,European Application No. 22212820.9, mailed Oct. 12, 2023 (7 pages).

*Primary Examiner* — Ryan Jager

(57) ABSTRACT

A frequency-detecting circuit, a DCC, and an electronic device. The frequency-detecting circuit includes a control-signal generating circuit generating a first control signal and a second control signal delayed relative to the first control signal; a charging and discharging path, under control of the second control signal, during a period with a pulse width when the second control signal is at a high level, performing the discharging process, and performing the charging process during another period when the second control signal is at a low level; and a control-voltage generating circuit, sampling values of a voltage of an output terminal of the charging and discharging path before the discharging process during a period with a pulse width when the first control signal is at the high level, to output a corresponding first voltage signal.

20 Claims, 8 Drawing Sheets

120
A
110
$CK_{in}$
EN
$A_1$
$D_1$
$N_1$
$CK_{ref}$
$A_2$
$CK_P$
$D_2$
$CK_{PD}$
120
$S_1$
$ND_1$
$C_1$
$S_2$
$ND_2$
$C_2$
$S_3$
$C_3$
$V_1$
130

(56) References Cited

U.S. PATENT DOCUMENTS

| | | | | |
|---|---|---|---|---|
| 2012/0280733 | A1 | 11/2012 | Zhu et al. | |
| 2015/0372682 | A1* | 12/2015 | Alexeyev | H03L 7/085 327/156 |
| 2019/0278401 | A1* | 9/2019 | Wang | G06F 3/044 |
| 2023/0387890 | A1* | 11/2023 | Wang | H03K 17/6872 |
| 2024/0106684 | A1* | 3/2024 | Wang | H04L 7/0037 |

* cited by examiner

FREQUENCY-DETECTING CIRCUIT, DUTY-CYCLE CORRECTOR, AND ELECTRONIC DEVICE

CROSS REFERENCE

The present application claims priorities and rights to Chinese Patent Application No. 202210580300.6, filed on May 25, 2022, and Chinese Patent Application No. 202210584059.4, filed on May 25, 2022, the entire contents of which are hereby incorporated by reference in their entireties.

TECHNICAL FIELD

The present disclosure relates to the field of circuit technologies, and in particular to a frequency-detecting circuit, a Duty-Cycle Corrector ("DCC"), and an electronic device.

BACKGROUND

A clock signal is usually used in electronic devices. The clock signal is generally used in synchronization circuits as a timer, ensuring relevant electronic components operate synchronously. In some application scenarios, a frequency of the clock signal is required to be detected. In general, a more complex circuit needs to be designed for a specific value of the frequency of the clock signal being accurately detected.

However, in other application scenarios, it is enough to detect a change of the frequency of the clock signal, and the specific value of the frequency is not required.

SUMMARY OF THE DISCLOSURE

The present disclosure provides a frequency-detecting circuit, a DCC, and an electronic device.

A frequency-detecting circuit is provided and includes a control-signal generating circuit, configured to receive a to-be-detected clock signal and generate a first control signal corresponding to the to-be-detected clock signal and a second control signal delayed relative to the first control signal; a charging and discharging path, coupled to the control-signal generating circuit, and performing a charging process or a discharging process under control of the second control signal, wherein during a period with a pulse width when the second control signal is at a high level, the charging and discharging path performs the discharging process, and the charging and discharging path performs the charging process during another period when the second control signal is at a low level; and a control-voltage generating circuit, coupled to an output terminal of the charging and discharging path and the control-signal generating circuit, and configured to sample values of a voltage of an output terminal of the charging and discharging path before the discharging process during a period with a pulse width when the first control signal is at the high level, to output a corresponding first voltage signal.

A DCC is provided. The DCC includes a filtering circuit, an input terminal of the filtering circuit being configured to input a first clock signal; a DC bias amplifying circuit, an input terminal of the DC bias amplifying circuit being coupled to an output terminal of the filtering circuit, and an output terminal of the DC bias amplifying circuit being configured to output a second clock signal; and an attenuation adjusting circuit, an input terminal of the attenuation adjusting circuit being coupled to the input terminal of the filtering circuit, and an output terminal of the attenuation adjusting circuit being coupled to the input terminal of the DC bias amplifying circuit; the attenuation adjusting circuit includes a frequency-detecting circuit above; the first clock signal is as the to-be-detected clock signal, the attenuation adjusting circuit performs an attenuation adjusting process for a signal output by the filtering circuit based on a frequency of the first clock signal, and the less the frequency of the first clock signal is, the greater a corresponding attenuation amplitude is.

An electronic device is provided and includes the frequency-detecting circuit described above.

BRIEF DESCRIPTION OF THE DRAWINGS

In order to more clearly illustrate the technical solutions in the embodiments of the present disclosure, a brief description of the accompanying drawings to be used in the description of the embodiments will be given below. It will be obvious that the accompanying drawings in the following description are only some embodiments of the present disclosure, and that other accompanying drawings may be obtained on the basis of these drawings without any creative effort for those skilled in the art.

DETAILED DESCRIPTION

The technical solutions in the embodiments of the present disclosure will be clearly and completely described below with reference to accompanying drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative efforts shall fall within the scope of the present disclosure.

Figure 1:
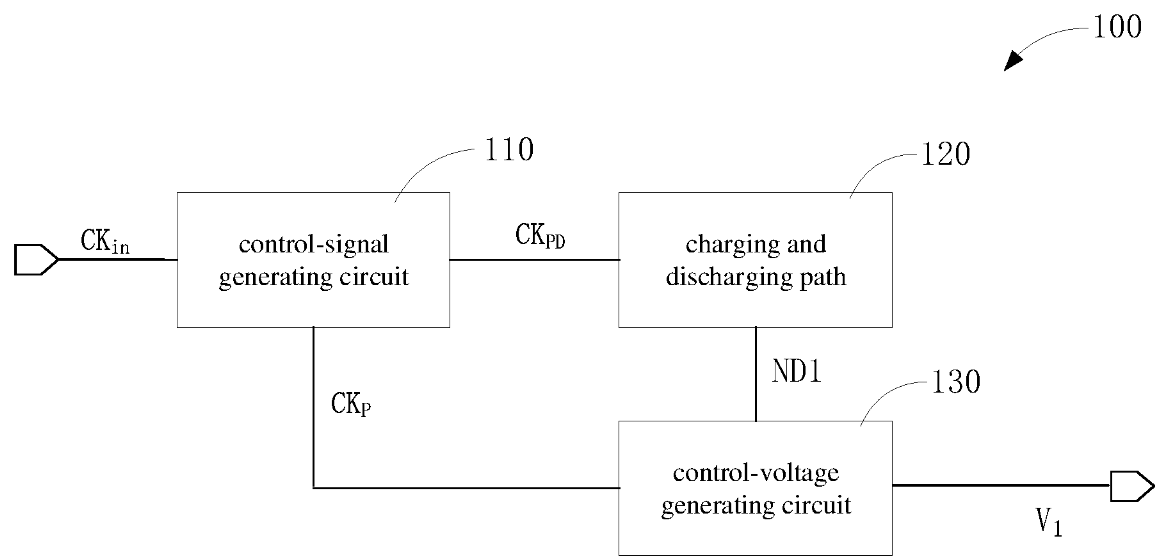
FIG. 1 is a structural schematic view of a frequency-detecting circuit according to a first embodiment of the present disclosure.

FIG. 1 is a structural schematic view of a frequency-detecting circuit according to a first embodiment of the present disclosure. The frequency-detecting circuit 100 includes a control-signal generating circuit 110, a charging and discharging path 120, and a control-voltage generating circuit 130.

The control-signal generating circuit 110 is configured to receive a to-be-detected clock signal $CK_{in}$ and generate a first control signal $CK_P$ corresponding to the to-be-detected clock signal $CK_{in}$ and a second control signal $CK_{PD}$ delayed relative to the first control signal $CK_P$.

The charging and discharging path 120 is coupled to the control-signal generating circuit 110, and performs a charging process or a discharging process under control of the second control signal $CK_{PD}$. During a period with a pulse width when the second control signal $CK_{PD}$ is at a high level, the charging and discharging path 120 performs the discharging process, and the charging and discharging path 120 performs the charging process during another period when the second control signal $CK_{PD}$ is at a low level.

The control-voltage generating circuit 130 is coupled to an output terminal of the charging and discharging path 120 and the control-signal generating circuit 110, and configured to sample values of a voltage signal ND1 of an output terminal of the charging and discharging path 120 before the discharging process during a period with a pulse width when the first control signal $CK_P$ is at the high level, to output a first voltage signal $V_1$.

In some embodiments, the less the frequency of the to-be-detected clock signal $CK_{in}$ is, the greater the voltage value of the first voltage signal $V_1$ is.

In some embodiments, a frequency of the second control signal $CK_{PD}$ is the same as the frequency of the to-be-detected clock signal $CK_{in}$, and the pulse width during which the second control signal $CK_{PD}$ is at the high level remains unchanged. Therefore, a discharging period of the charging and discharging path 120 in a clock cycle of the second control signal $CK_{PD}$ is fixed, and a charging period of the charging and discharging path 120 is determined by a length of the second control signal $CK_{PD}$ being at the low level, therefore, the charging period of the charging and discharging path 120 is determined by a cycle length of the second control signal $CK_{PD}$. The less the frequency of the second control signal $CK_{PD}$ is, the greater the cycle length is, and the longer the charging period of the charging and discharging path 120 is, the greater a voltage value of the voltage signal ND1 of the output terminal of the charging and discharging path 120 is. Therefore, the voltage value of the voltage signal ND1 of the output terminal of the charging and discharging path 120 may reflect a magnitude of the frequency of the to-be-detected clock signal $CK_{in}$. Since the voltage signal ND1 of the output terminal of the charging and discharging path 120 has a saw tooth shape as the charging and discharging path 120 being periodically charged and discharged, the control-voltage generating circuit 130 further samples the voltage signal ND1 during the period with the pulse width when the first control signal $CK_P$ is at the high level and outputs a sampled voltage signal as the first voltage signal $V_1$. Since a high-level pulse of the first control signal $CK_P$ is earlier than a high-level pulse of the second control signal $CK_{PD}$, a sampling time point being before the discharging process of each cycle of the charging and discharging path 120 may be guaranteed. The sampled voltage signal reflects a voltage value reached in each charging process, and is output as the first voltage signal $V_1$. Therefore, a magnitude of the first voltage signal $V_1$ reflects a magnitude of the cycle length (i.e., the frequency) of the second control signal $CK_{PD}$, i.e., the first voltage signal $V_1$ reflects the frequency of the to-be-detected clock signal $CK_{in}$.

Different from the prior arts, the frequency-detecting circuit provided in this embodiment of the present disclosure includes the control-signal generating circuit, the charging and discharging path, and the control-voltage generating circuit. The control-signal generating circuit is configured to receive the to-be-detected clock signal and generate the first control signal corresponding to the to-be-detected clock signal and the second control signal delayed relative to the first control signal; the charging and discharging path is coupled to the control-signal generating circuit, and performing the charging process or a discharging process under the control of the second control signal, during the period with the pulse width when the second control signal is at the high level, the charging and discharging path performs the discharging process, and the charging and discharging path performs the charging process during another period when the second control signal is at the low level; and the control-voltage generating circuit is coupled to the output terminal of the charging and discharging path and the control-signal generating circuit, and configured to sample values of the voltage of the output terminal of the charging and discharging path before the discharging process during the period with the pulse width when the first control signal is at the high level, to output the corresponding first voltage signal. In this way, the corresponding voltage signal is generated based on the frequency of the clock signal, so as to correspondingly determine the magnitude of the frequency of the clock signal through detecting the voltage value of the voltage signal. Further, in some scenarios where the accurate frequency of the clock signal is not required to be acquired and only the magnitude of the frequency needs to be determined, the magnitude of the frequency of the clock signal may be directly reflected through determining the magnitude of the voltage value of the generated voltage signal. In addition, the voltage signal may be directly configured as the input of the subsequent circuit to indicate the frequency of the clock signal.

Figure 2:
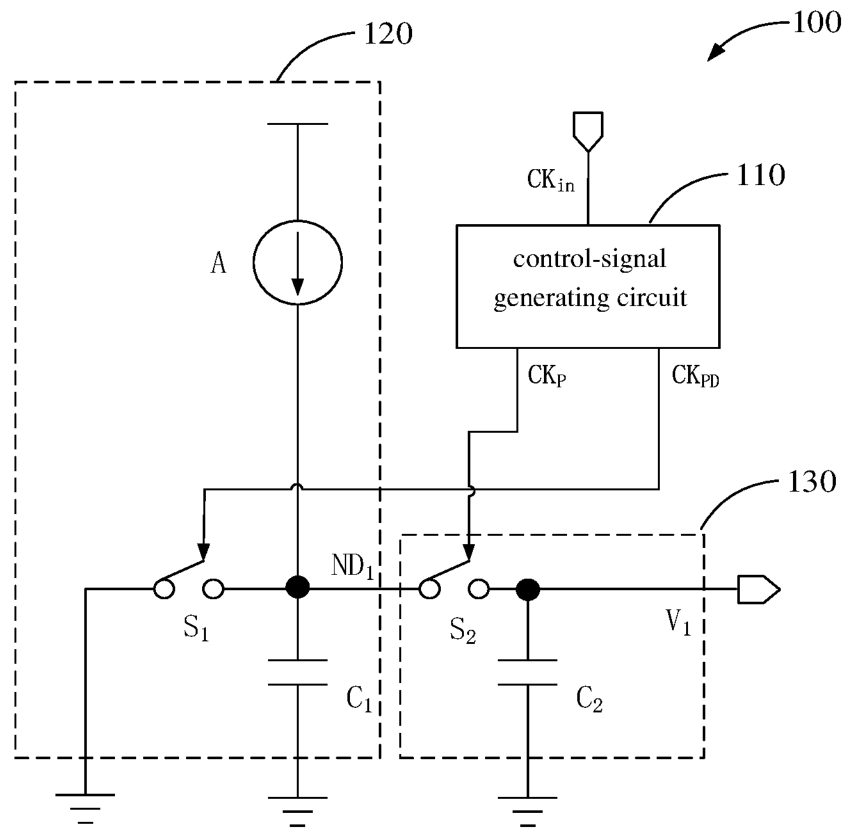
FIG. 2 is a structural schematic view of the frequency-detecting circuit according to a second embodiment of the present disclosure.

FIG. 2 is a structural schematic view of the frequency-detecting circuit according to a second embodiment of the present disclosure. The frequency-detecting circuit 100 includes the control-signal generating circuit 110, the charging and discharging path 120, and the control-voltage generating circuit 130.

The control-signal generating circuit 110 is configured to receive the to-be-detected clock signal $CK_{in}$ and generate the first control signal $CK_P$ corresponding to the to-be-detected clock signal $CK_{in}$ and the second control signal $CK_{PD}$ delayed relative to the first control signal $CK_P$.

The charging and discharging path 120 is coupled to the control-signal generating circuit 110, and performs the charging process or the discharging process under the control of the second control signal $CK_{PD}$. During the period with the pulse width when the second control signal $CK_{PD}$ is at the high level, the charging and discharging path 120 performs the discharging process, and the charging and discharging path 120 performs the charging process during another period when the second control signal $CK_{PD}$ is at the low level.

The control-voltage generating circuit 130 is coupled to the output terminal of the charging and discharging path 120 and the control-signal generating circuit 110, and configured to sample values of the voltage signal ND1 of the output terminal of the charging and discharging path 120 before the discharging process during the period with the pulse width when the first control signal $CK_P$ is at the high level, to output the first voltage signal $V_1$. The less the frequency of the to-be-detected clock signal $CK_{in}$ is, the greater the voltage value of the first voltage signal $V_1$ is.

Specifically, in this embodiment, the charging and discharging path 120 further includes a power supply A, a first switch $S_1$ and a first capacitor $C_1$. A first terminal of the first capacitor $C_1$ is coupled to the power supply A, and a second terminal of the first capacitor $C_1$ is grounded. A first terminal of the first switch $S_1$ is coupled to the first terminal of the first capacitor $C_1$, a second terminal of the first switch $S_1$ is grounded, and a control terminal of the first switch $S_1$ inputs the second control signal $CK_{PD}$. The control-voltage generating circuit 130 further includes a second switch $S_2$ and a second capacitor $C_2$. A first terminal of the second switch $S_2$ is coupled to the first terminal of the first capacitor $C_1$ (i.e., the output terminal ND1 of the charging and discharging path 120), and a control terminal of the second switch $S_2$ inputs the first control signal $CK_P$. A first terminal of the second capacitor $C_2$ is coupled to a second terminal of the second switch $S_2$ and configured to output the first voltage signal $V_1$, and a second terminal of the second capacitor $C_2$ is grounded.

Figure 3:
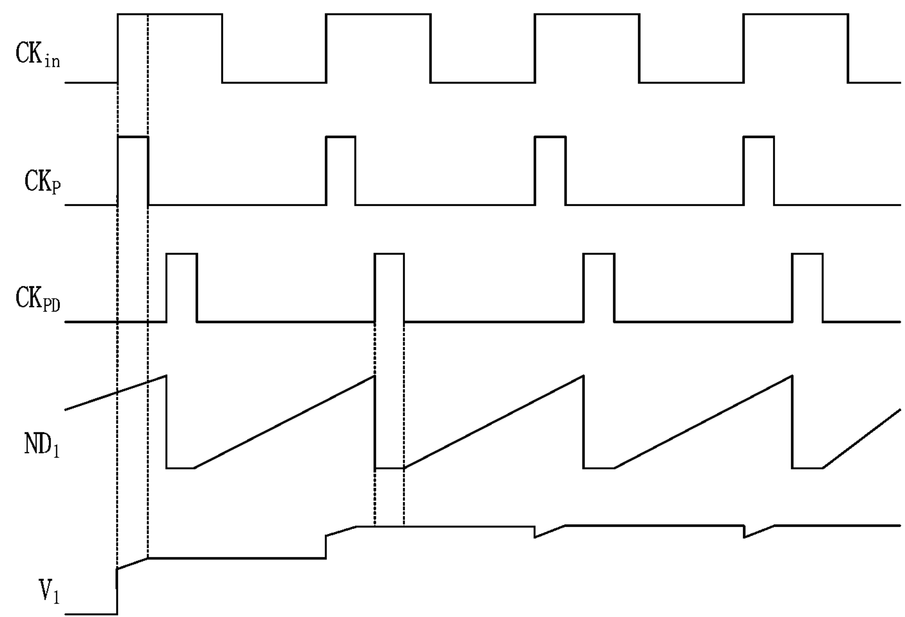
FIG. 3 is a schematic view of a waveform of a signal at each node according to the second embodiment of the present disclosure.

An operating principle of circuits of this embodiment will be described in the following with reference to FIG. 3. FIG. 3 is a schematic view of a waveform of a signal at each node according to the second embodiment of the present disclosure. In this embodiment, the first switch $S_1$ and the second switch $S_2$ are turned on when control terminals thereof are at a logic high level "1", and turned off when the control terminals thereof are at a logic low level "0".

When the first control signal $CK_P$ is the logic high level "1" and the second control signal $CK_{PD}$ is the logic low level "0", the second switch $S_2$ is turned on, the first switch $S_1$ is turned off, and the power supply A charges for the first capacitor $C_1$ and the second capacitor $C_2$, a voltage of a first node signal $ND_1$ is increased, and the first voltage signal $V_1$ is increased. When the first control signal $CK_P$ is the logic high level "1" and the second control signal $CK_{PD}$ is the logic low level "0", the power supply A continues to charge for the first capacitor $C_1$. It can be seen that a charging period of the first capacitor $C_1$ is determined by a length of a period when the second control signal $CK_{PD}$ is the logic low level "0". Since a pulse width when the first control signal $CK_P$ is the logic high level "1" and a pulse width when the second control signal $CK_{PD}$ is the logic high level "1" are fixed (a method for fixing the pulse width will be described in the following). A length of a period when the first control signal $CK_P$ is the logic low level "0" is determined by the cycle length of the first control signal $CK_P$ The length of the period when the second control signal $CK_{PD}$ is the logic low level "0" is determined by the cycle length of the second control signal $CK_{PD}$. Since both the first control signal $CK_P$ and the second control signal $CK_{PD}$ are generated by processing the to-be-detected clock signal both the first control signal $CK_P$ and the second control signal $CK_{PD}$ have the same cycle with the to-be-detected clock signal $CK_{in}$. Therefore, a period of the power supply A charging for the first capacitor $C_1$ is determined by the cycle (or frequency) of the to-be-detected clock signal $CK_{in}$. The less the frequency of the to-be-detected clock signal $CK_{in}$ is, the greater the cycle is, the greater the period of the power supply A charging for the first capacitor $C_1$ is. When the first control signal $CK_P$ is the logic low level "0" and the second control signal $CK_{PD}$ is the logic high level "1", the second switch $S_2$ is turned off, the first switch $S_1$ is turned on, the first capacitor $C_1$ is discharged, and the second capacitor $C_2$ is maintained. The voltage of the first node signal $ND_1$ is decreased, and the first voltage signal $V_1$ is maintained. After multiple clock cycles, the first capacitor $C_1$ is charged and discharged cyclically, the voltage of the first node signal $ND_1$ has the saw tooth shape. The second capacitor $C_2$ is charged multiple times, and the first voltage signal $V_1$ is increased through a charge share between the first capacitor $C_1$ and the second capacitor $C_2$. Under a condition that the frequency of the to-be-detected clock signal $CK_{in}$ is stable, a stable voltage value is finally reached. The stable voltage value may reflect a value reached in each charging cycle of the first node signal $ND_1$, that is, the stable voltage value may reflect the magnitude of the cycle length of the second control signal $CK_{PD}$, i.e., the magnitude of the frequency of the to-be-detected clock signal $CK_{in}$.

Figure 4:
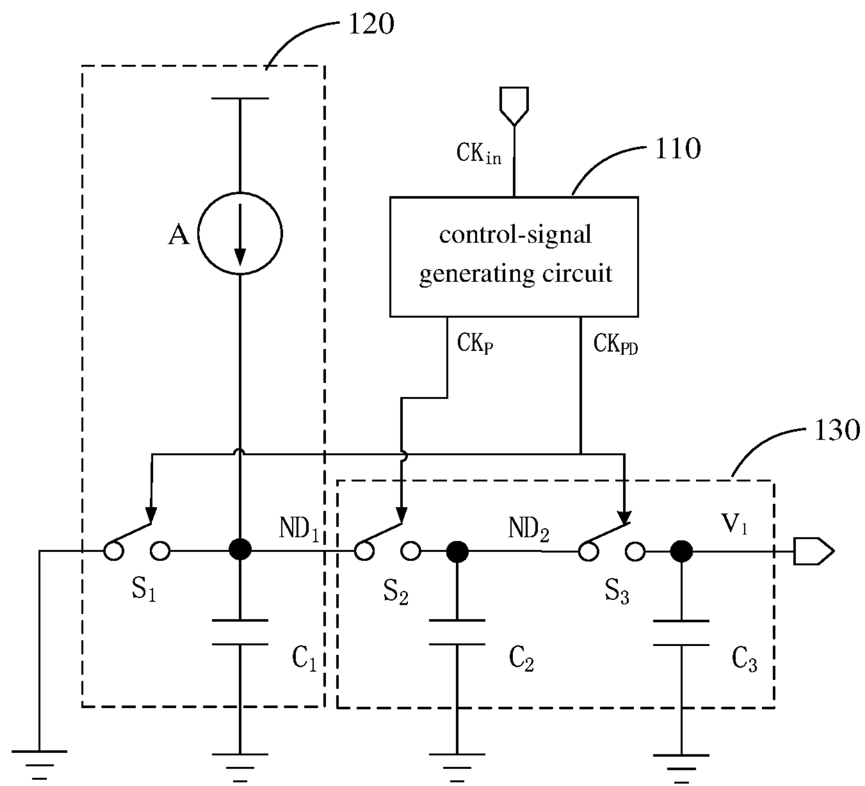
FIG. 4 is a structural schematic view of the frequency-detecting circuit according to a third embodiment of the present disclosure.

FIG. 4 is a structural schematic view of the frequency-detecting circuit according to a third embodiment of the present disclosure. The frequency-detecting circuit 100 includes the control-signal generating circuit 110, the charging and discharging path 120, and the control-voltage generating circuit 130.

The control-signal generating circuit 110 is configured to receive the to-be-detected clock signal $CK_{in}$ and generate the first control signal $CK_P$ corresponding to the to-be-detected clock signal $CK_{in}$ and the second control signal $CK_{PD}$ delayed relative to the first control signal $CK_P$.

The charging and discharging path 120 is coupled to the control-signal generating circuit 110, and performs the charging process or the discharging process under the control of the second control signal $CK_{PD}$. During the period with the pulse width when the second control signal $CK_{PD}$ is at the high level, the charging and discharging path 120 performs the discharging process, and the charging and discharging path 120 performs the charging process during another period when the second control signal $CK_{PD}$ is at the low level.

The control-voltage generating circuit 130 is coupled to the output terminal of the charging and discharging path 120 and the control-signal generating circuit 110, and configured to sample values of the voltage signal ND1 of the output terminal of the charging and discharging path 120 before the discharging process during the period with the pulse width when the first control signal $CK_P$ is at the high level, to output the first voltage signal $V_1$. The less the frequency of the to-be-detected clock signal $CK_{in}$ is, the greater the voltage value of the first voltage signal $V_1$ is.

Specifically, in this embodiment, the charging and discharging path 120 further includes a power supply A, a first switch $S_1$ and a first capacitor $C_1$. A first terminal of the first capacitor $C_1$ is coupled to the power supply, and a second terminal of the first capacitor $C_1$ is grounded. A first terminal of the first switch $S_1$ is coupled to the first terminal of the first capacitor $C_1$, a second terminal of the first switch $S_1$ is grounded, and a control terminal of the first switch $S_1$ inputs the second control signal $CK_{PD}$. The control-voltage generating circuit 130 further includes a second switch $S_2$ and a second capacitor $C_2$, a third switch $S_3$ and a third capacitor $C_3$. The first terminal of the second switch $S_2$ is coupled to the first terminal of the first capacitor $C_1$ (i.e., the output terminal of the charging and discharging path 120), and the control terminal of the second switch $S_2$ inputs the first control signal $CK_P$. The first terminal of the second capacitor $C_2$ is coupled to the second terminal of the second switch $S_2$, and the second terminal of the second capacitor $C_2$ is grounded. A first terminal of the third switch $S_3$ is coupled to the first terminal of the second capacitor $C_2$, and a control terminal of the third switch inputs the second control signal $CK_{PD}$. A first terminal of the third capacitor $C_3$ is coupled to a second terminal of the third switch $S_3$ and configured to output the first voltage signal $V_1$, and a second terminal of the third capacitor $C_3$ is grounded.

Different from the second embodiments, in this embodiment, a third switch $S_3$ and a third capacitor $C_3$ are further added, and the first terminal of the third capacitor $C_3$ is configured as the output terminal of the first voltage signal $V_1$.

Figure 5:
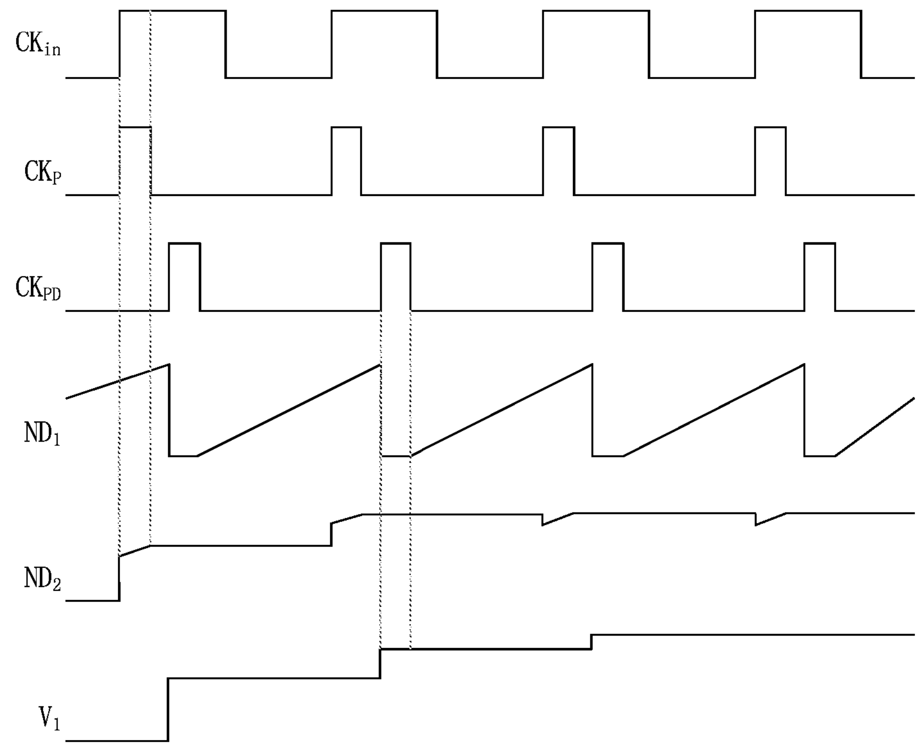
FIG. 5 is a schematic view of the waveform of the signal at each node according to the third embodiment of the present disclosure.

The operating principle of the circuits of this embodiment will be described with reference to FIG. 5. FIG. 5 is a schematic view of the waveform of the signal at each node according to the third embodiment of the present disclosure. In this embodiment, the first switch $S_1$, the second switch $S_2$, and the third switch $S_3$ are turned on when control terminals thereof are at the logic high level "1", and turned off when the control terminals thereof are at the logic low level "0".

When the first control signal $CK_P$ is the logic high level "1" and the second control signal $CK_{PD}$ is the logic low level "0", the second switch $S_2$ is turned on, the first switch $S_1$ and the third switch $S_3$ are turned off, and the power supply A charges for the first capacitor $C_1$ and the second capacitor $C_2$, the voltage of the first node signal $ND_1$ and a voltage of a second node signal $ND_2$ are increased. When the first control signal $CK_P$ is the logic high level "1" and the second control signal $CK_{PD}$ is the logic low level "0", the power supply A continues to charge for the first capacitor $C_1$. It can be seen that the charging period of the first capacitor $C_1$ is determined by the length of the period when the second control signal $CK_{PD}$ is the logic low level "0". Since the pulse width when the first control signal $CK_P$ is the logic high level "1" and the pulse width when the second control signal $CK_{PD}$ is the logic high level "1" are fixed (the method for fixing the pulse width will be described in the following). The length of the period when the first control signal $CK_P$ is the logic low level "0" is determined by the cycle length of the first control signal $CK_P$ The length of the period when the second control signal $CK_{PD}$ is the logic low level "0" is determined by the cycle length of the second control signal $CK_{PD}$. Since both the first control signal $CK_P$ and the second control signal $CK_{PD}$ are generated by processing the to-be-detected clock signal $CK_{in}$, both the first control signal $CK_P$ and the second control signal $CK_{PD}$ have the same cycle with the to-be-detected clock signal $CK_{in}$. Therefore, the period of the power supply A charging for the first capacitor $C_1$ is determined by the cycle (or frequency) of the to-be-detected clock signal $CK_{in}$. The less the frequency of the to-be-detected clock signal $CK_{in}$ is, the greater the cycle is, the greater the period of the power supply A charging for the first capacitor $C_1$ is. When the first control signal $CK_P$ is the logic low level "0" and the second control signal $CK_{PD}$ is the logic high level "1", the second switch $S_2$ is turned off, the first switch $S_1$ and the third switch $S_3$ are turned on, the first capacitor $C_1$ is discharged, the second capacitor $C_2$ is maintained, and the third capacitor $C_3$ is charged. The voltage of the first node signal $ND_1$ is decreased, the voltage of the second node signal $ND_2$ is maintained, and the first voltage signal $V_1$ is increased. After the multiple clock cycles, the first capacitor $C_1$ is charged and discharged cyclically, the voltage of the first node signal $ND_1$ has the saw tooth shape. The second capacitor $C_2$ is charged multiple times, and the voltage of the second node signal $ND_2$ is increased through the charge share between the first capacitor $C_1$ and the second capacitor $C_2$. The third capacitor $C_3$ is charged multiple times, the first voltage signal $V_1$ is increased through a charge share between the third capacitor $C_3$ and the second capacitor $C_2$, and a stable voltage value is finally reached (Under the condition that the frequency of the to-be-detected clock signal $CK_{in}$ is stable). The stable voltage value may reflect the value reached in each charging cycle of the first node signal $ND_1$, that is, the stable voltage value may reflect the magnitude of the cycle length of the second control signal $CK_{PD}$, i.e., the magnitude of the frequency of the to-be-detected clock signal $CK_{in}$. However, different from the second embodiment, since the second node signal $ND_2$ is still in the saw tooth shape although the second node signal $ND_2$ is continuously increased, a quality of an output voltage may be affected. Therefore, the third capacitor $C_3$ is added on the basis of the second embodiment. It can be seen from FIG. 5 that a voltage effect of the first voltage signal $V_1$ is better than that of the second node signal $ND_2$.

Figure 6:
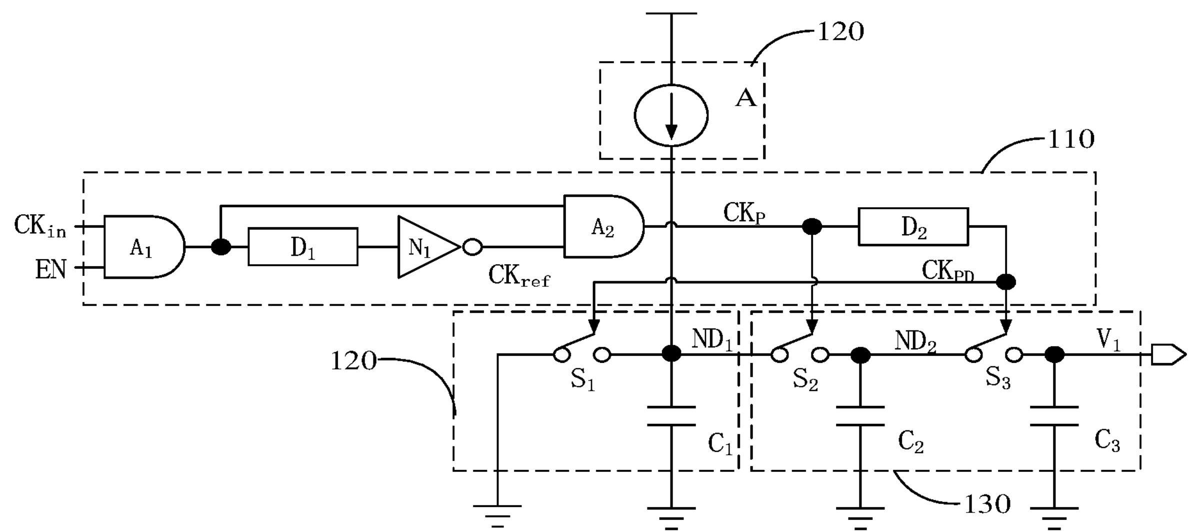
FIG. 6 is a structural schematic view of the frequency-detecting circuit according to a fourth embodiment of the present disclosure.

As shown in FIG. 6, FIG. 6 is a structural schematic view of the frequency-detecting circuit according to a fourth embodiment of the present disclosure. The frequency-detecting circuit 100 includes the control-signal generating circuit 110, the charging and discharging path 120, and the control-voltage generating circuit 130.

In some embodiments, the control-signal generating circuit 110 may include a first AND gate unit $A_1$, a first delay unit $D_1$, a first inversion unit $N_1$ (non-gate unit), a second AND gate unit $A_2$, and a second delay unit $D_2$. A first terminal of the first AND gate unit $A_1$ inputs the to-be-detected clock signal $CK_{in}$, and a second terminal of the first AND gate unit $A_1$ inputs an enable signal EN (being the logic high level "1" during operating). An input terminal of the first delay unit $D_1$ is coupled to an output terminal of the first AND gate unit $A_1$ (In some embodiments, the control-signal generating circuit 110 may not include the first AND gate unit $A_1$, and the input terminal of the first delay unit $D_1$ is directly connected to the to-be-detected clock signal $CK_{in}$). An input terminal of the first inversion unit $N_1$ is coupled to the output terminal of the first delay unit $D_1$. A first input terminal of the second AND gate unit $A_2$ is coupled to the input terminal of first delay unit $D_1$, a second input terminal of the second AND gate unit $A_2$ is coupled to an output terminal of the first inversion unit $N_1$, and an output terminal of the second AND gate unit $A_2$ outputs the first control signal $CK_P$. An input terminal of the second delay unit $D_2$ is coupled to the output terminal of the second AND gate unit, and an output terminal of the second delay unit $D_2$ outputs the second control signal $CK_{PD}$.

Specifically, in this embodiment, the charging and discharging path 120 further includes the power supply A, the first switch $S_1$ and the first capacitor $C_1$. The first terminal of the first capacitor $C_1$ is coupled to the power supply, and the second terminal of the first capacitor $C_1$ is grounded. The first terminal of the first switch $S_1$ is coupled to the first terminal of the first capacitor $C_1$, the second terminal of the first switch $S_1$ is grounded, and the control terminal of the first switch $S_1$ inputs the second control signal $CK_{PD}$. The control-voltage generating circuit 130 further includes the second switch $S_2$ and the second capacitor $C_2$, the third switch $S_3$ and the third capacitor $C_3$. The first terminal of the second switch $S_2$ is coupled to the first terminal of the first capacitor $C_1$ (i.e., the output terminal of the charging and discharging path 120), and the control terminal of the second switch $S_2$ inputs the first control signal $CK_P$. The first terminal of the second capacitor $C_2$ is coupled to the second terminal of the second switch $S_2$, and the second terminal of the second capacitor $C_2$ is grounded. The first terminal of the third switch $S_3$ is coupled to the first terminal of the second capacitor $C_2$, and the control terminal of the third switch inputting the second control signal $CK_{PD}$. The first terminal of the third capacitor $C_3$ is coupled to the second terminal of the third switch $S_3$ and configured to output the first voltage signal $V_1$, and the second terminal of the third capacitor $C_3$ is grounded.

In some embodiments, the first switch $S_1$, the second switch $S_2$, and the third switch $S_3$ are implemented by an nMOS transistor, or a transmission gate formed of an nMOS transistor and a pMOS transistor.

Figure 7:
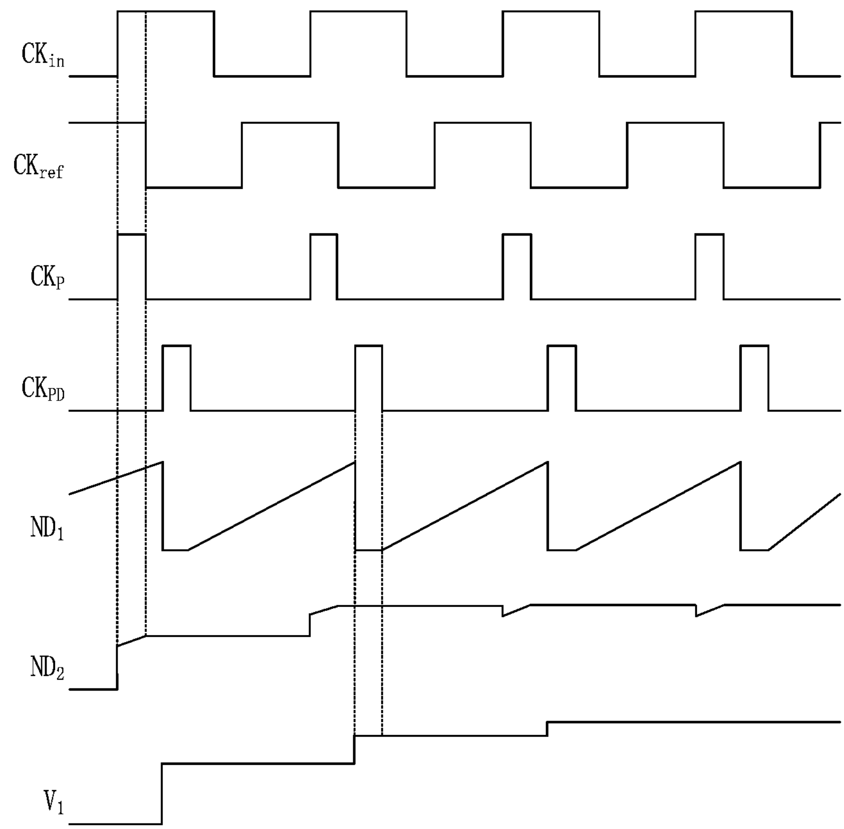
FIG. 7 is a schematic view of the waveforms of the signal according to the fourth embodiment of the present disclosure.

The operating principle of the circuits of this embodiment will be described with reference to FIG. 7. FIG. 7 is a schematic view of the waveforms of the signal according to the fourth embodiment of the present disclosure. In this embodiment, the first switch $S_1$, the second switch $S_2$, and the third switch $S_3$ are turned on when the control terminals thereof are at the logic high level "1", and turned off when the control terminals thereof are at the logic low level "0".

A reference clock signal $CK_{ref}$ is obtained after the to-be-detected clock signal $CK_{in}$ is processed by the first delay unit D1 and the first inversion unit $N_1$. The reference clock signal $CK_{ref}$ is opposite to the to-be-detected clock signal $CK_{in}$ and has a certain delay relative to the to-be-detected clock signal $CK_{in}$. A "AND" logic process may be performed for the to-be-detected clock signal $CK_{in}$ and the reference clock signal $CK_{ref}$, and the first control signal $CK_P$ may be obtained. In this way, both the cycle length of the first control signal $CK_P$ and the cycle length of the second control signal $CK_{PD}$ are the same with a cycle length of the to-be-detected clock signal $CK_{in}$. The pulse width when the first control signal $CK_P$ is the logic high level "1" and the pulse width when the second control signal $CK_{PD}$ is the logic high level "1" are fixed, which both are determined the first delay unit $D_1$.

When the first control signal $CK_P$ is the logic high level "1" and the second control signal $CK_{PD}$ is the logic low level "0", the second switch $S_2$ is turned on, the first switch $S_1$ and the third switch $S_3$ are turned off, and the power supply A charges for the first capacitor $C_1$ and the second capacitor $C_2$, the voltage of the first node signal $ND_1$ and a voltage of a second node signal $ND_2$ are increased. When the first control signal $CK_P$ is the logic high level "1" and the second control signal $CK_{PD}$ is the logic low level "0", the power supply A continues to charge for the first capacitor $C_1$. It can be seen that the charging period of the first capacitor $C_1$ is determined by the length of the period when the second control signal $CK_{PD}$ is the logic low level "0". Since the pulse width when the first control signal $CK_P$ is the logic high level "1" and the pulse width when the second control signal $CK_{PD}$ is the logic high level "1" are fixed. The length of the period when the first control signal $CK_P$ is the logic low level "0" is determined by the cycle length of the first control signal $CK_P$ The length of the period when the second control signal $CK_{PD}$ is the logic low level "0" is determined by the cycle length of the second control signal $CK_{PD}$. Since both the first control signal $CK_P$ and the second control signal $CK_{PD}$ are generated by processing the to-be-detected clock signal both the first control signal $CK_P$ and the second control signal $CK_{PD}$ have the same cycle with the to-be-detected clock signal $CK_{in}$. Therefore, the period of the power supply A charging for the first capacitor $C_1$ is determined by the cycle (or frequency) of the to-be-detected clock signal $CK_{in}$. The less the frequency of the to-be-detected clock signal $CK_{in}$ is, the greater the cycle is, the greater the period of the power supply A charging for the first capacitor $C_1$ is. When the first control signal $CK_P$ is the logic low level "0" and the second control signal $CK_{PD}$ is the logic high level "1", the second switch $S_2$ is turned off, the first switch S and the third switch $S_3$ are turned on, the first capacitor $C_1$ is discharged, the second capacitor $C_2$ is maintained, and the third capacitor $C_3$ is charged. The voltage of the first node signal $ND_1$ is decreased, the voltage of the second node signal $ND_2$ is maintained, and the first voltage signal $V_1$ is increased. After the multiple clock cycles, the first capacitor $C_1$ is charged and discharged cyclically, the voltage of the first node signal $ND_1$ has the saw tooth shape. The second capacitor $C_2$ is charged multiple times, and the voltage of the second node signal $ND_2$ is increased through the charge share between the first capacitor $C_1$ and the second capacitor $C_2$. The third capacitor $C_3$ is charged multiple times, the first voltage signal $V_1$ is increased through the charge share between the third capacitor $C_3$ and the second capacitor $C_2$, and finally reached the stable voltage value (Under the condition that the frequency of the to-be-detected clock signal $CK_{in}$ is stable). The stable voltage value may reflect the value reached in each charging cycle of the first node signal $ND_1$, that is, the stable voltage value may reflect the magnitude of the cycle length of the second control signal $CK_{PD}$, i.e., the magnitude of the frequency of the to-be-detected clock signal $CK_{in}$. However, different from the second embodiment, since the second node signal $ND_2$ is still in the saw tooth shape although the second node signal $ND_2$ is continuously increased, a quality of an output voltage may be affected. Therefore, the third capacitor $C_3$ is added on the basis of the second embodiment. It can be seen from FIG. 7 that the voltage effect of the first voltage signal $V_1$ is better than that of the second node signal $ND_2$.

Figure 8:
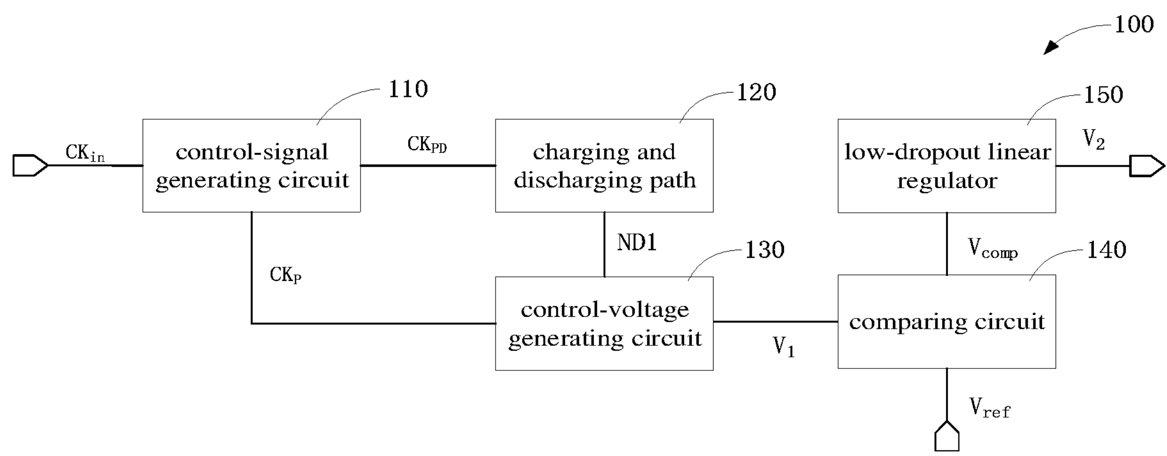
FIG. 8 is a structural schematic view of the frequency-detecting circuit according to a fifth embodiment of the present disclosure.

As shown in FIG. 8, FIG. 8 is a structural schematic view of the frequency-detecting circuit according to a fifth embodiment of the present disclosure. The frequency-detecting circuit 100 includes the control-signal generating circuit 110, the charging and discharging path 120, the control-voltage generating circuit 130, a comparing circuit 140, and a low-dropout linear regulator 150.

In some embodiments, the control-signal generating circuit 110 is configured to receive the to-be-detected clock signal $CK_{in}$ and generate the first control signal $CK_P$ corresponding to the to-be-detected clock signal $CK_{in}$ and the second control signal $CK_{PD}$ delayed relative to the first control signal $CK_P$. The charging and discharging path 120 is coupled to the control-signal generating circuit 110, and performs the charging process or the discharging process under the control of the second control signal $CK_{PD}$. During the period with the pulse width when the second control signal $CK_{PD}$ is at the high level, the charging and discharging path 120 performs the discharging process, and the charging and discharging path 120 performs the charging process during another period when the second control signal $CK_{PD}$ is at the low level. The control-voltage generating circuit 130 is coupled to the output terminal of the charging and discharging path 120 and the control-signal generating circuit 110, and configured to sample values of the voltage signal ND1 of the output terminal of the charging and discharging path 120 before the discharging process during the period with the pulse width when the first control signal $CK_P$ is at the high level, to output the first voltage signal $V_1$. The less the frequency of the to-be-detected clock signal $CK_{in}$ is, the greater the voltage value of the first voltage signal $V_1$ is.

In this embodiment, the comparing circuit 140 is coupled to the control-voltage generating circuit, and configured to compare the voltage value of the first voltage signal with a voltage value of at least one preset reference-voltage signal $V_{ref}$, to obtain a corresponding comparing-result signal $V_{comp}$. The low-dropout linear regulator 150 is coupled to an output terminal of the comparing circuit 140 and configured to generate a matched second voltage signal $V_2$ according to the comparing-result signal $V_{comp}$.

In some embodiments, the frequency value of the to-be-detected clock signal $CK_{in}$ is negatively correlated with a voltage value of the first voltage signal $V_1$. That is, the less the frequency value of the to-be-detected clock signal $CK_{in}$ the greater the voltage value of the first voltage signal $V_1$. The comparing circuit 140 may adopt a hysteresis comparator, a non-inverting input terminal of the hysteresis comparator inputs the reference voltage signal $V_{ref}$, and an inverting input terminal of the hysteresis comparator inputs the first voltage signal $V_1$. Adopting the hysteresis comparator may avoid a problem that the comparing circuit 140 flips back and forth due to a jitter of a frequency of the to-be-detected clock signal $CK_{in}$. In other embodiments, the comparing circuit 140 may also be implemented by adopting comparators of other types.

Figure 9:
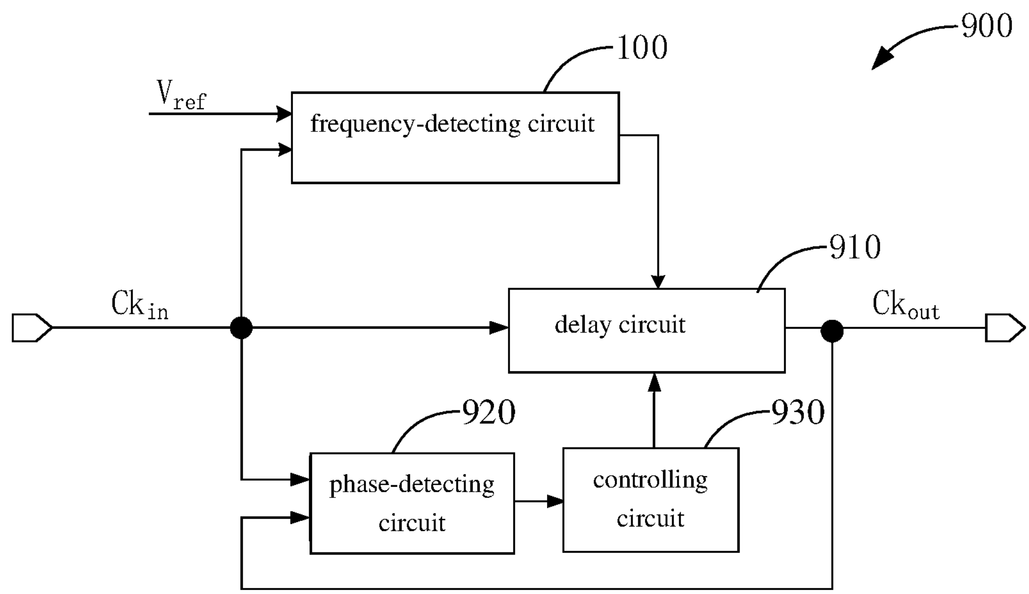
FIG. 9 is a structural schematic view of a delay-locked circuit according to an embodiment of the present disclosure.

Combining the embodiments in reference with FIG. 8, the frequency-detecting circuit above may be applied to a delay-locked circuit. As shown in FIG. 9, FIG. 9 is a structural schematic view of a delay-locked circuit according to an embodiment of the present disclosure. The delay-locked circuit 900 includes a delay circuit 910, a phase-detecting circuit 920, a controlling circuit 930, and the frequency-detecting circuit 100 described in the above embodiments.

Figure 10:
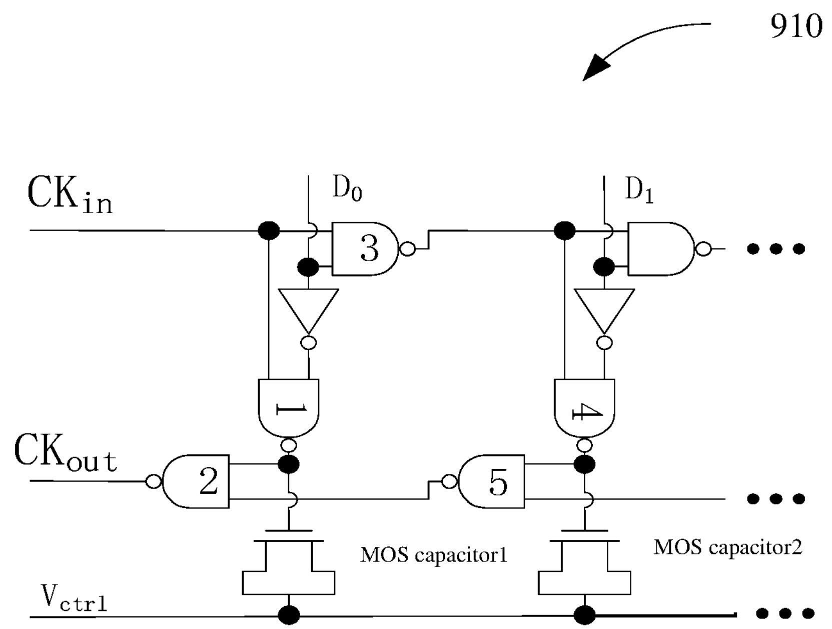
FIG. 10 is a structural schematic view of a delay circuit according to an embodiment of the present disclosure.

FIG. 10 is a structural schematic view of the delay circuit 910 according to an embodiment of the present disclosure. The delay circuit 910 includes a delay line. Each operation of adjusting of the delay circuit 910 is achieved by changing control signals $D_0$, $D_1$ . . . $D_n$ (only $D_0$ and $D_1$ are shown in FIG. 10 for a simplicity) to adjust the number of gate circuits accessed to the delay line, such that a total delay of a second clock signal $CK_{out}$ relative to a first clock signal $CK_{in}$ (i.e., the to-be-detected clock signal $CK_{in}$) may be adjusted, and adjusting step by step until an edge of the first clock signal $CK_{in}$ may be aligned to an edge of the second clock signal $CK_{out}$ (i.e., locked). For example, at the beginning, the control signal $D_0$ is 0, and the first clock signal $CK_{in}$ only passes through a first delay path formed by the two leftmost NOT-AND (NAND) gates (i.e., an NAND gate 1 and an NAND gate 2) and is output as the second clock signal $CK_{out}$ When the "locked" above cannot be achieved, the control signal $D_0$ is changed to be 1, and the control signal $D_1$ is 0. The first clock signal $CK_{in}$ passes through a second delay path formed by four NAND gates (i.e., the NAND gate 1, the NAND gate 2, an NAND gate 3, and an NAND gate 4) and is output as the second clock signal $CK_{out}$ . . . , and so on. Through changing the control signals step by step, the delay path may be changed until the total delay generated by the delay line allow the edge of the first clock signal $CK_{in}$ to be aligned to the edge of the first clock signal $CK_{in}$ (i.e., locked).

The structure of the delay circuit 910 in FIG. 10 is only an example, and the delay line may also be implemented by other gate circuits. It can be seen that an adjusting amount (i.e., a length of each operation) of the delay in each operation of the delay line is related to a delay generated by a single gate circuit. The delay of the single gate circuit is adjusted by adjusting a voltage of the power supply in the above embodiments described with reference to FIG. 9.

In other embodiments, the frequency-detecting circuit 100 in FIG. 8 may not include the low-dropout linear regulator 150. A delaying device may be added to each delay node of each delay path of the delay line, the delay device may be an MOS capacitor 1, . . . , or an MOS capacitor n shown in FIG. 10 (only the MOS capacitor 1 and the MOS capacitor 2 are shown in FIG. 10 for the simplicity). The MOS capacitors are turned on or off in response to a logic level of the comparing result signal $V_{comp}$, thereby adjusting the delay of each delay path of the delay line, i.e., the delay (i.e., the length of each operation) of the delay line in each operation of adjusting. Specifically, when the first clock signal $CK_{in}$ is less than a preset threshold, the comprising result signal $V_{comp}$ controls the MOS capacitor of each delay node to be turned on, such that both the delay of the first delay path and the delay of the second delay path are increased correspondingly, and thereby increasing the delay (i.e., the length of each operation) of the delay line in each operation of adjusting. When the first clock signal $CK_{in}$ is greater than a preset threshold, the comprising result signal $V_{comp}$ controls the MOS capacitor of each delay node to be turned off, such that both the delay of the first delay path and the delay of the second delay path are reduced correspondingly, and thereby reducing the delay (i.e., the length of each operation) of the delay line in each operation of adjusting. A principle of an MOS tube forming the capacitor is that a gate oxide layer between a gate and a channel is configured as an insulating medium, the gate is configured as an upper electrode plate, and three terminals (i.e., a source, a drain, and a substrate) are electrically connected together to form a lower electrode plate.

Different from the prior arts, the frequency-detecting circuit provided in this embodiment of the present disclosure includes the control-signal generating circuit, the charging and discharging path, and the control-voltage generating circuit. The control-signal generating circuit is configured to receive the to-be-detected clock signal and generate the first control signal corresponding to the to-be-detected clock signal and the second control signal delayed relative to the first control signal; the charging and discharging path is coupled to the control-signal generating circuit, and performing the charging process or a discharging process under the control of the second control signal, during the period with the pulse width when the second control signal is at the high level, the charging and discharging path performs the discharging process, and the charging and discharging path performs the charging process during another period when the second control signal is at the low level; and the control-voltage generating circuit is coupled to the output terminal of the charging and discharging path and the control-signal generating circuit, and configured to sample values of the voltage of the output terminal of the charging and discharging path before the discharging process during the period with the pulse width when the first control signal is at the high level, to output the corresponding first voltage signal. In this way, the corresponding voltage signal is generated based on the frequency of the clock signal, so as to correspondingly determine the magnitude of the frequency of the clock signal through detecting the voltage value of the voltage signal. Further, in some scenarios where the accurate frequency of the clock signal is not required to be acquired and only the magnitude of the frequency needs to be determined, the magnitude of the frequency of the clock signal may be directly reflected through determining the magnitude of the voltage value of the generated voltage signal. In addition, the voltage signal may be directly configured as the input of the subsequent circuit to indicate the frequency of the clock signal.

Figure 11:
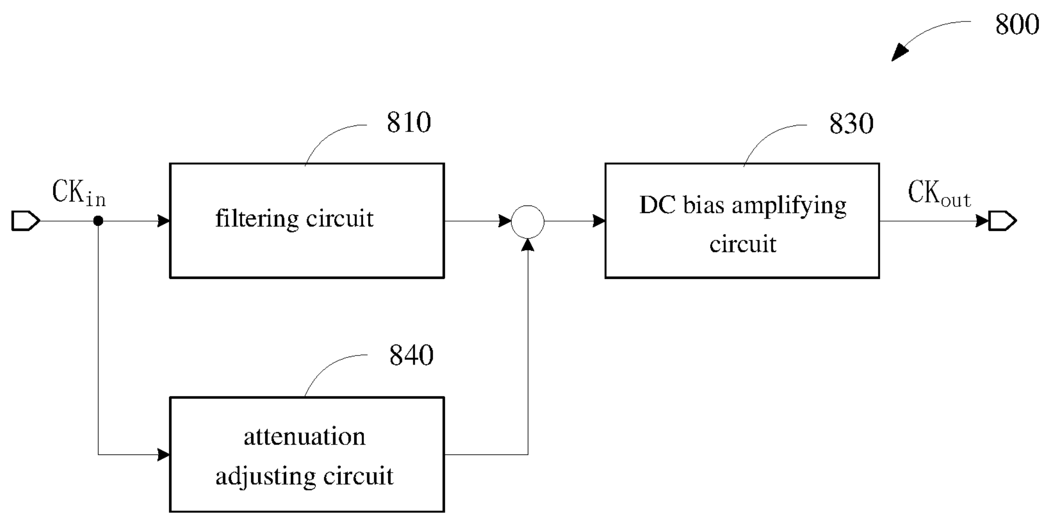
FIG. 11 is a structural schematic view of a DCC according to an embodiment of the present disclosure.

Combining the embodiments described in reference with FIGS. 1-7, the first voltage signal $V_1$ output by the frequency-detecting circuit above may be applied to multiple application scenarios requiring the frequency of the to-be-detected clock signal $CK_{in}$ changing. For example, the first voltage signal $V_1$ may be applied to a DCC. As shown in FIG. 11, FIG. 11 is a structural schematic view of a DCC according to an embodiment of the present disclosure. The DCC 800 includes a filtering circuit 810, a DC bias amplifying circuit 830, and an attenuation adjusting circuit 840.

In some embodiments, an input terminal of the filtering circuit 810 is configured to input a first clock signal $CK_{in}$. An input terminal of the DC bias amplifying circuit 830 is coupled to an output terminal of the filtering circuit 810, and an output terminal of the DC bias amplifying circuit 830 is configured to output a second clock signal $CK_{out}$. An input terminal of the attenuation adjusting circuit 840 is coupled to the input terminal of the filtering circuit 810, and an output terminal of the attenuation adjusting circuit 840 is coupled to the input terminal of the DC bias amplifying circuit 830. The attenuation adjusting circuit 840 includes the frequency-detecting circuit described above, as shown in FIG. 11. The first clock signal $CK_{in}$ is as the to-be-detected clock signal $CK_{in}$ in FIG. 1. The attenuation adjusting circuit 840 performs an attenuation adjusting process for a signal output by the filtering circuit 810 based on a frequency of the first clock signal $CK_{in}$. In an embodiment, the less the frequency of the first clock signal $CK_{in}$ is, the greater a corresponding attenuation amplitude is.

It can be understood that in some embodiments, the DCC does not include the attenuation adjusting circuit 840. Components of the first clock signal $CK_{in}$ after being processed by the filtering circuit 810 also include a low-frequency component having a greater ratio and a greater signal amplitude. The low-frequency component having the greater ratio may have an influence on a DC bias point of the DC bias amplifying circuit 830 in a subsequent level, which may deteriorate a DCC correcting capability.

Figure 12:
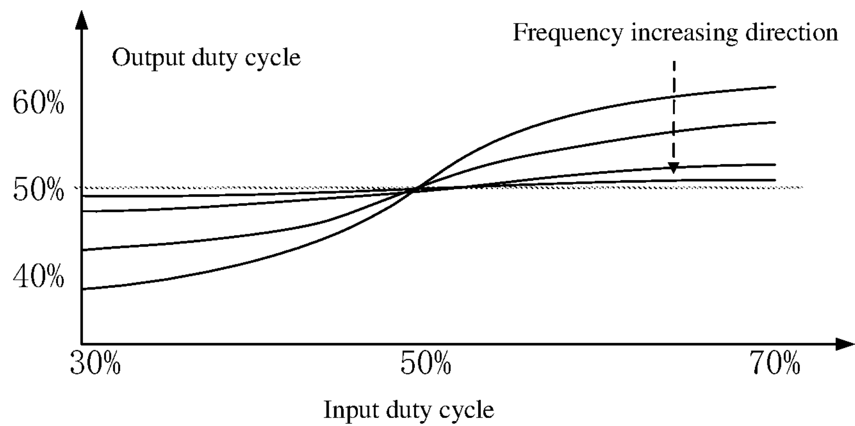
FIG. 12 is a schematic view of changes of duty cycles of a first clock signal and a second clock signal without an attenuation process.

FIG. 12 is a schematic view of changes of duty cycles of a first clock signal and a second clock signal without an attenuation process. Different curves in FIG. 12 correspond to first clock signals $CK_{in}$ of different frequencies. It can be seen that the greater the frequency of the first clock signal $CK_{in}$ is, the closer to an ideal value 50% the duty cycle of the second clock signal $CK_{out}$ obtained after a converting process is. On the contrary, the less the frequency of the first clock signal $CK_{in}$ is, the greater a difference between the duty cycle of the second clock signal $CK_{out}$ obtained after the converting process and the ideal value 50% is, which is not expected.

Therefore, in this embodiment, the attenuation adjusting circuit 840 is added. The attenuation adjusting circuit 840 is configured to perform the attenuation adjusting process for the signal output by the filtering circuit 810 based on the frequency of the first clock signal $CK_{in}$, and the less the frequency of the first clock signal $CK_{in}$ is, the greater the corresponding attenuation amplitude is. In this way, an amplitude of the low-frequency component of a signal input into the DC bias amplifying circuit 830 may be reduced, and the influence of the low-frequency component on the DC bias point of the DC bias amplifying circuit 830 in the subsequent level may be reduced. Further, since the greater the frequency of the first clock signal $CK_{in}$ is, the less the corresponding attenuation amplitude is, which will not cause much influence on an original circuit.

Figure 13:
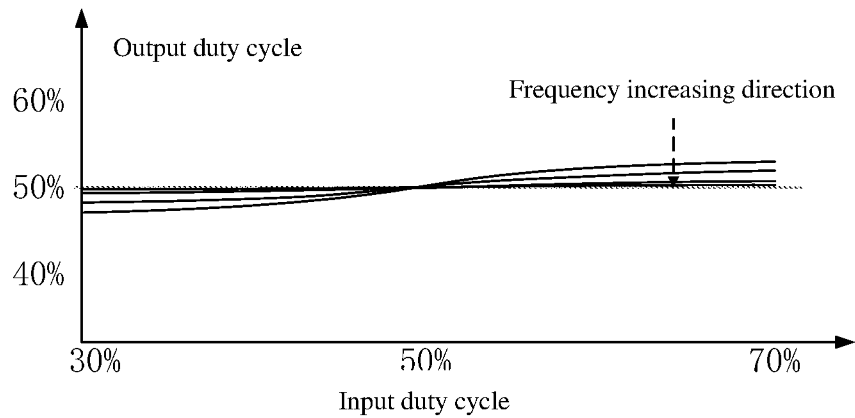
FIG. 13 is a schematic view of the changes of the duty cycles of the first clock signal and the second clock signal after the attenuation process.

Comparing FIG. 12 with FIG. 13, FIG. 13 is a schematic view of the changes of the duty cycles of the first clock signal and the second clock signal after the attenuation process. Different curves in FIG. 13 correspond to the first clock signals $CK_{in}$ of the different frequencies. Comparing FIG. 12 with FIG. 13, the greater the frequency of the first clock signal $CK_{in}$ is, the closer to the ideal value 50% the duty cycle of the second clock signal $CK_{out}$ obtained after the converting process is. However, when the frequency of the first clock signals $CK_{in}$ becomes less, the difference between the duty cycle of the second clock signal $CK_{out}$ obtained after the converting process and the ideal value 50% is reduced relative to FIG. 12, i.e., closer to the ideal value 50% than FIG. 12.

Figure 14:
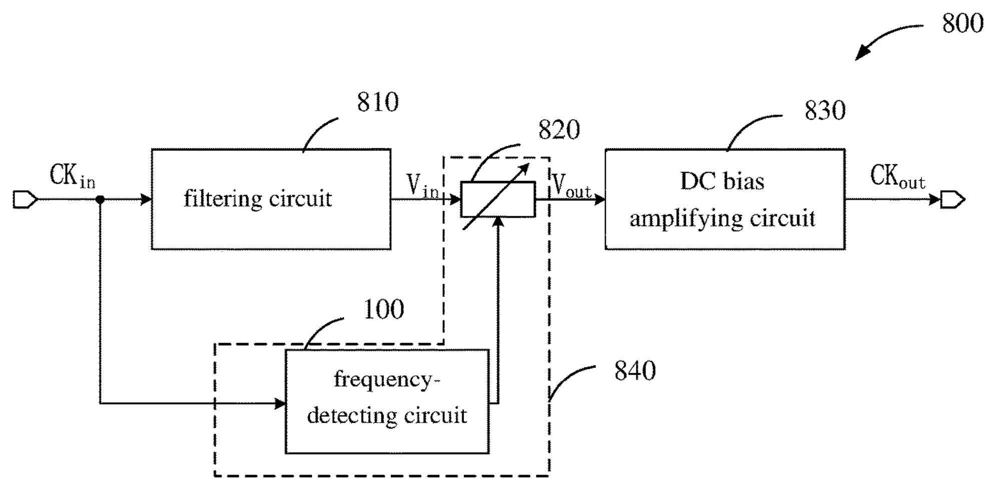
FIG. 14 is a structural schematic view of the DCC according to another embodiment of the present disclosure.

FIG. 14 is a structural schematic view of the DCC according to another embodiment of the present disclosure. The DCC includes the filtering circuit 810, the DC bias amplifying circuit 830, and the attenuation adjusting circuit 840. The attenuation adjusting circuit 840 includes the frequency-detecting circuit 100 described in the above embodiments.

In some embodiments, the attenuation adjusting circuit 840 further includes an adjustable resistance device 820. A first terminal of the adjustable resistance device 820 is coupled to the output terminal of the filtering circuit 810, a second terminal of the adjustable resistance device 820 is coupled to the input terminal of the DC bias amplifying circuit 830, and the greater an on-resistance of the adjustable resistance device 820, the less a DC component of a signal $V_{out}$ of the input terminal of the DC bias amplifying circuit 830. An input terminal of the frequency-detecting circuit 100 is coupled to the input terminal of the filtering circuit 810, and an output terminal of the frequency-detecting circuit 100 is coupled to a control terminal of the adjustable resistance device 820. The first voltage signal $V_1$ is generated by the frequency-detecting circuit based on the frequency of the first clock signal $CK_{in}$, the control terminal of the adjustable resistance device is configured to input the first voltage signal, and the on-resistance of the adjustable resistance device 820 changes in response to a voltage value of the first voltage signal $V_1$ changing.

In some embodiments, the frequency-detecting circuit 100 generates the corresponding first voltage signal $V_1$ based on a frequency of the first clock signal $CK_{in}$, the on-resistance of the adjustable resistance device 820 changes in response to a voltage value of the first voltage signal $V_1$ changing.

In an embodiment, the less the frequency of the first clock signal $CK_{in}$ is, the greater the voltage value of the first voltage signal $V_1$ correspondingly generated by the frequency-detecting circuit 100 is, the greater the on-resistance of the adjustable resistance device 820 is, the greater an attenuating degree of a corresponding signal $V_{in}$ output by the filtering circuit 810 is, that is, the less the generated low-frequency DC component of the signal $V_{out}$ of the input terminal of the DC bias amplifying circuit 830 is. Specifically, since a relationship between the signal $V_{in}$ output by the filtering circuit 810 and the signal V out of the input terminal of the DC bias amplifying circuit 830 satisfies the following formula:

$$V_{out}=R_{out}/R_{in}+R_{out}\times V_{in}$$

$R_{in}$ is the on-resistance of the adjustable resistance device 820, and $R_{out}$ is a total resistance of N numbers of resistors $R_0$ connected in series in the DC bias amplifying circuit 830 (as shown in the following description about FIG. 15 for details). The less the frequency of the first clock signal $CK_{in}$ is, the greater the voltage value of the first voltage signal $V_1$ is, the greater the on-resistance $R_{in}$ of a changeable resistor is, and the less the signal $V_{out}$ of the input terminal of the DC bias amplifying circuit 830 is, i.e., the greater the attenuating degree of a corresponding signal $V_{in}$ output by the filtering circuit 810 is. In this way, the first clock signal $CK_{in}$ in a low frequency adjusting the duty cycle of the second clock signal $CK_{out}$ output by the DCC 800 may be achieved.

Figure 15:
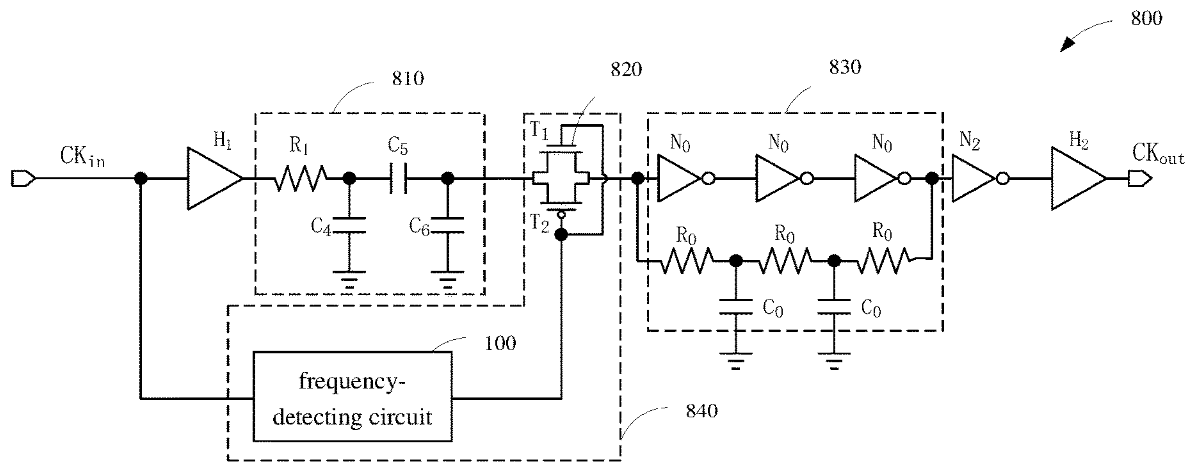
FIG. 15 is a structural schematic view of the DCC according to a yet embodiment of the present disclosure.

FIG. 15 is a structural schematic view of the DCC according to a yet embodiment of the present disclosure. The DCC 800 includes the filtering circuit 810, the DC bias amplifying circuit 830, and the attenuation adjusting circuit 840. The attenuation adjusting circuit 840 includes the frequency-detecting circuit 100 described in the above embodiments.

In some embodiments, the attenuation adjusting circuit 840 further includes the adjustable resistance device 820. The first terminal of the adjustable resistance device 820 is coupled to the output terminal of the filtering circuit 810, the second terminal of the adjustable resistance device 820 is coupled to the input terminal of the DC bias amplifying circuit 830, and the greater an on-resistance of the adjustable resistance device 820, the less the DC component of the signal $V_{out}$ of the input terminal of the DC bias amplifying circuit 830. The input terminal of the frequency-detecting circuit 100 is coupled to the input terminal of the filtering circuit 810, and the output terminal of the frequency-detecting circuit 100 is coupled to the control terminal of the adjustable resistance device 820. The first voltage signal $V_1$ is generated by the frequency-detecting circuit based on the frequency of the first clock signal $CK_{in}$, the control terminal of the adjustable resistance device is configured to input the first voltage signal, and the on-resistance of the adjustable resistance device 820 changes in response to the voltage value of the first voltage signal $V_1$ changing.

In this embodiment, the adjustable resistance device 820 is a transmission gate unit. The transmission gate unit includes an nMOS transistor and a pMOS transistor. A first terminal of the nMOS transistor is coupled to the output terminal of the filtering circuit 810, a second terminal of the nMOS transistor is coupled to the input terminal of the DC bias amplifying circuit 830, and a control terminal of the nMOS transistor is coupled to the output terminal of the frequency-detecting circuit 100. A first terminal of the pMOS transistor is coupled to the output terminal of the filtering circuit 810, a second terminal of the pMOS transistor is coupled to the input terminal of the DC bias amplifying circuit 830, and a control terminal of the pMOS transistor is coupled to the output terminal of the frequency-detecting circuit 100.

Figure 16:
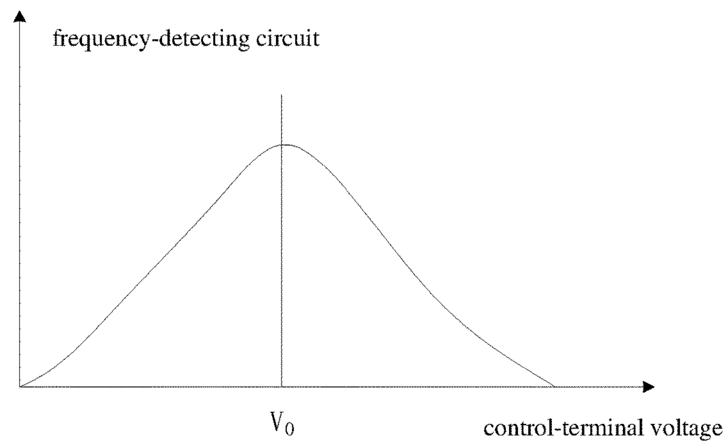
FIG. 16 is a diagram showing a relationship between an on-resistance and a control-terminal voltage of a transmission gate according to some embodiments of the present disclosure.

As shown in FIG. 16, FIG. 16 is a diagram showing a relationship between an on-resistance and a control-terminal voltage of a transmission gate according to some embodiments of the present disclosure. It can be seen from FIG. 16 that when a control-terminal voltage of the transmission gate (i.e., a gate voltage of the nMOS transistor and a gate voltage of the pMOS transistor) is a threshold voltage $V_0$, a resistance of the transmission gate is the greatest. When the control-terminal voltage is decreased or increased on the basis of $V_0$, the resistance of the transmission gate gradually decreases. Therefore, in this embodiment, a changing range of the first voltage signal $V_1$ output by the frequency-detecting circuit 100 may be controlled to be between 0-$V_0$, such that the resistance of the transmission gate may increase with the first voltage signal $V_1$ increasing.

In an embodiment, the filtering circuit 810 includes a low-pass filtering circuit and a high-pass filtering circuit. An input terminal of the low-pass filtering circuit is configured to input the first clock signal $CK_{in}$, an input terminal of the high-pass filtering circuit is coupled to an output terminal of the low-pass filtering circuit, and an output terminal of the high-pass filtering circuit is coupled to the input terminal of the DC bias amplifying circuit 830.

Specifically, the low-pass filtering circuit is configured to filter the low-frequency component in the signal. The low-pass filtering circuit includes a first resistor $R_1$ and a fourth capacitor $C_4$. A first terminal of the first resistor $R_1$ is configured to input the first clock signal $CK_{in}$. A first terminal of the fourth capacitor $C_4$ is coupled to a second terminal of the first resistor $R_1$, and a second terminal of the fourth capacitor $C_4$ is grounded.

Specifically, the high-pass filtering circuit is configured to filter a high-frequency component in the signal. The high-pass filtering circuit includes a fifth capacitor $C_5$ and a sixth capacitor $C_6$. A first terminal of the fifth capacitor $C_5$ is coupled to the second terminal of the fourth capacitor $C_4$, and a second terminal of the fifth capacitor $C_5$ is coupled to the input terminal of the DC bias amplifying circuit 830. A first terminal of the sixth capacitor $C_6$ is coupled to the second terminal of the fifth capacitor $C_5$, and a second terminal of the sixth capacitor $C_6$ is grounded.

In an embodiment, the DC bias amplifying circuit 830 includes an inverting unit group, a resistance unit group, and a capacitor group. The inverting unit group includes N numbers of inverting units $N_0$, the N numbers of inverting units $N_0$ are connected in series in sequence, and an input terminal of the first inverting unit $N_0$ in the N numbers of inverting units $N_0$ is coupled to the output terminal of the filtering circuit 810. An output terminal of the last inverting unit $N_0$ in the N numbers of inverting units $N_0$ is configured to output the second clock signal $CK_{out}$. The resistance unit group includes N numbers of resistors $R_0$, the N numbers of resistors $R_0$ are connected in series in sequence, and the resistance unit group and the inverting unit group are connected in parallel. The capacitor group includes N−1 numbers of capacitors $C_0$, a first terminal of each capacitor $C_0$ of the N−1 numbers of capacitors $C_0$ is sequentially coupled between two adjacent resistors $R_0$ of the N numbers of resistors $R_0$, and a second terminal of each capacitor $C_0$ of the N−1 numbers of capacitors $C_0$ is grounded. N is an odd number greater than 3.

The DCC 800 further includes a second inverting unit $N_2$, an input terminal of the second inverting unit $N_2$ is coupled to the output terminal of the last inverting unit $N_0$ in the N inverting units $N_0$, and an output terminal of the second inverting unit $N_2$ is configured to output the second clock signal $CK_{out}$.

It can be understood that multiple inverting units are inversely shaped step by step, and multiple RC units (including $R_0$ and $C_0$) provide the DC bias point.

In an embodiment, the DCC 800 further includes a first buffer unit $H_1$ and a second buffer unit $H_2$, an input terminal of the first buffering unit $H_1$ is configured to input the first clock signal $CK_{in}$, and an output terminal of the first buffering unit $H_1$ is coupled to the input terminal of the filtering circuit 810. An input terminal of the second buffering unit $H_2$ is coupled to the output terminal of the DC bias amplifying circuit 830, and an output terminal of the second buffering unit $H_2$ is configured to output the second clock signal $CK_{out}$. Different from the prior art, the DCC provided in the embodiments of the present disclosure includes the filter circuit, the DC bias amplifying circuit, and then attenuation adjusting circuit. The input terminal of the filtering circuit is configured to input the first clock signal. The input terminal of the DC bias amplifying circuit is coupled to the output terminal of the filtering circuit, and the output terminal of the DC bias amplifying circuit is configured to output the second clock signal. The input terminal of the attenuation adjusting circuit is coupled to the input terminal of the filtering circuit, and the output terminal of the attenuation adjusting circuit is coupled to the input terminal of the DC bias amplifying circuit. The attenuation adjusting circuit includes the frequency-detecting circuit, and the first clock signal is as the to-be-detected clock signal. the attenuation adjusting circuit performs the attenuation adjusting process for the signal output by the filtering circuit based on the frequency of the first clock signal, and the less the frequency of the first clock signal is, the greater the corresponding attenuation amplitude is. Accordingly, when the frequency of the first clock signal input, the attenuation adjusting process is correspondingly performed for an output signal of the filtering circuit, such that an amplitude of a low-frequency DC component of the output signal of the filtering circuit may be attenuated. In this way, after the output signal is input into the subsequent DC bias amplifying circuit, an influence of the low-frequency DC component on the DC bias amplifying circuit may be reduced, which may improve a correcting capability of the duty cycle, such that when the frequency of the input first clock signal is less, the duty cycle of the second clock signal after the duty cycle is adjusted may be close to the ideal value, such as 50%.

Figure 17:
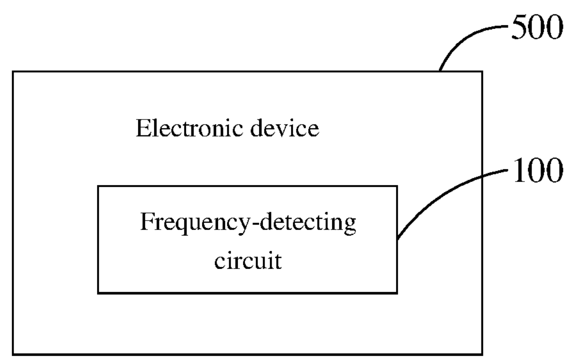
FIG. 17 is a structural schematic view of an electronic device according to an embodiment of the present disclosure.

FIG. 17 is a structural schematic view of an electronic device according to an embodiment of the present disclosure. The electronic device 500 includes the frequency-detecting circuit 100 in the embodiments described above.

Figure 18:
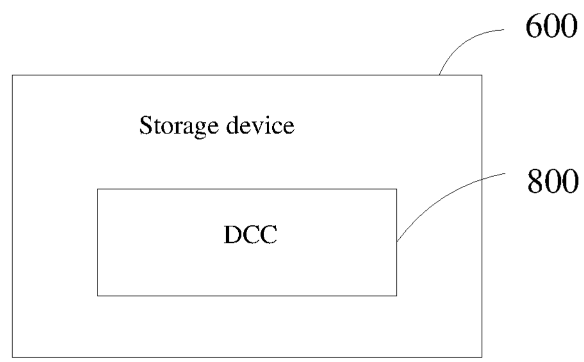
FIG. 18 is a structural schematic view of a storage device according to an embodiment of the present disclosure.

FIG. 18 is a structural schematic view of a storage device according to an embodiment of the present disclosure. The storage device 600 includes a DCC 800. The DCC 800 is the same as the DCC provided in the above embodiments, and has a structure and an operating principle similar to those of the DCC provided in the above embodiments, which is not repeated herein. The storage device 600 may be the dynamic random access memory (DRAM), such as a DDR (Double Data Rate) SDRAM (Synchronous Dynamic Random-Access Memory).

When the embodiments of the present disclosure are implemented in a form of a software functional unit and the software functional unit is sold or adopted as an independent product, the software functional unit may be stored in a computer-readable storage medium. Based on this comprehension, the technical solutions of the present disclosure may be embodied in a form of a software product in essence, or a part of the technical solutions contributing to the prior art, or all or a part of the technical solutions may be embodied in the form of the software product. A computer software product is stored in a storage medium, including several instructions configured to cause a computer device (which may be a personal computer, a server, or a network device, etc.) or a processor to execute all or a part of operations of the methods described in each embodiment of the present disclosure. The above storage medium includes a U disk, a mobile hard disk, a Read-Only Memory (ROM), a Random Access Memory (RAM), a magnetic disk, or an optical disk, and other media capable of storing program codes.

The above is only some embodiments of the present disclosure and is not intended to limit the scope of the present disclosure. Any equivalent structure or equivalent process transformation using the specification and the accompanying drawings of the present disclosure, or direct or indirect application in other related technical fields, is included in the scope of the present disclosure.

What is claimed is:

1. A frequency-detecting circuit, comprising:

a control-signal generating circuit, configured to receive a to-be-detected clock signal and generate a first control signal corresponding to the to-be-detected clock signal and a second control signal delayed relative to the first control signal;

a charging and discharging path, coupled to the control-signal generating circuit, and performing a charging process or a discharging process under control of the second control signal, wherein during a period with a pulse width when the second control signal is at a high level, the charging and discharging path performs the discharging process, and the charging and discharging path performs the charging process during another period when the second control signal is at a low level; and a control-voltage generating circuit, coupled to an output terminal of the charging and discharging path and the control-signal generating circuit, and configured to sample values of a voltage of an output terminal of the charging and discharging path before the discharging process during a period with a pulse width when the first control signal is at the high level, to output a corresponding first voltage signal.

2. The frequency-detecting circuit according to claim 1, wherein the less a frequency of the to-be-detected clock signal is, the greater a voltage value of the first voltage signal is.

3. The frequency-detecting circuit according to claim 1, wherein a frequency of the second control signal is the same as the frequency of the to-be-detected clock signal, and the pulse width during which the second control signal is at the high level remains unchanged.

4. The frequency-detecting circuit according to claim 1, wherein the charging and discharging path further comprises:

a power supply;

a first capacitor, a first terminal of the first capacitor being coupled to the power supply, and a second terminal of the first capacitor being grounded; and a first switch, a first terminal of the first switch being coupled to the first terminal of the first capacitor, a second terminal of the first switch being grounded, and a control terminal of the first switch inputting the second control signal.

5. The frequency-detecting circuit according to claim 4, wherein the control-voltage generating circuit further comprises:

a second switch, a first terminal of the second switch being coupled to the first terminal of the first capacitor, and a control terminal of the second switch inputting the first control signal; and a second capacitor, a first terminal of the second capacitor being coupled to a second terminal of the second switch and configured to output the first voltage signal, and a second terminal of the second capacitor being grounded.

6. The frequency-detecting circuit according to claim 5, wherein the control-voltage generating circuit further comprises:

a third switch, a first terminal of the third switch being coupled to the first terminal of the second capacitor, and a control terminal of the third switch inputting the second control signal; and a third capacitor, a first terminal of the third capacitor being coupled to a second terminal of the third switch and configured to output the first voltage signal, and a second terminal of the third capacitor is grounded.

7. The frequency-detecting circuit according to claim 6, wherein the first switch, the second switch, and the third switch are implemented by an nMOS transistor, or a transmission gate formed of an nMOS transistor and a pMOS transistor.

8. The frequency-detecting circuit according to claim 1, wherein the control-signal generating circuit comprises:

a first delay unit, an output terminal of the first delay unit is configured to receive the to-be-detected clock signal;

a first inversion unit, an input terminal of the first inversion unit is coupled to the output terminal of the first delay unit;

an AND gate unit, a first input terminal of the AND gate unit being configured to receive the to-be-detected clock signal, a second input terminal of the AND gate unit being coupled to an output terminal of the first inversion unit, and an output terminal of the AND gate unit outputting the first control signal; and a second delay unit, an input terminal of the second delay unit being coupled to the output terminal of the AND gate unit, and an output terminal of the second delay unit outputting the second control signal.

9. The frequency-detecting circuit according to claim 1, further comprising:

a comparing circuit, coupled to the control-voltage generating circuit, and configured to compare the voltage value of the first voltage signal with a voltage value of at least one preset reference-voltage signal, to obtain a corresponding comparing-result signal.

10. The frequency-detecting circuit according to claim 9, further comprising:

a low-dropout linear regulator (150), coupled to an output terminal of the comparing circuit (140), and configured to generate a matched second voltage signal ($V_2$) according to the comparing-result signal ($V_{comp}$).

11. A Duty-Cycle Corrector (DCC), characterized by comprising:

a filtering circuit, an input terminal of the filtering circuit being configured to input a first clock signal;

a DC bias amplifying circuit, an input terminal of the DC bias amplifying circuit being coupled to an output terminal of the filtering circuit, and an output terminal of the DC bias amplifying circuit being configured to output a second clock signal; and an attenuation adjusting circuit, an input terminal of the attenuation adjusting circuit being coupled to the input terminal of the filtering circuit, and an output terminal of the attenuation adjusting circuit being coupled to the input terminal of the DC bias amplifying circuit;

wherein the attenuation adjusting circuit comprises a frequency-detecting circuit comprising:

a control-signal generating circuit, configured to receive a to-be-detected clock signal and generate a first control signal corresponding to the to-be-detected clock signal and a second control signal delayed relative to the first control signal;

a charging and discharging path, coupled to the control-signal generating circuit, and performing a charging process or a discharging process under control of the second control signal, wherein during a period with a pulse width when the second control signal is at a high level, the charging and discharging path performs the discharging process, and the charging and discharging path performs the charging process during another period when the second control signal is at a low level; and a control-voltage generating circuit, coupled to an output terminal of the charging and discharging path and the control-signal generating circuit, and configured to sample values of a voltage of an output terminal of the charging and discharging path before the discharging process during a period with a pulse width when the first control signal is at the high level, to output a corresponding first voltage signal;

wherein the first clock signal is as the to-be-detected clock signal, the attenuation adjusting circuit performs an attenuation adjusting process for a signal output by the filtering circuit based on a frequency of the first clock signal.

12. The DCC according to claim 11, wherein the less a frequency of the to-be-detected clock signal is, the greater a voltage value of the first voltage signal is.

13. The DCC according to claim 11, wherein the attenuation adjusting circuit further comprises:

an adjustable resistance device, a first terminal of the adjustable resistance device being coupled to the output terminal of the filtering circuit, and a second terminal of the adjustable resistance device being coupled to the input terminal of the DC bias amplifying circuit, wherein the greater an on-resistance of the adjustable resistance device is, the less a DC component of a signal of the input terminal of the DC bias amplifying circuit is;

wherein an input terminal of the frequency-detecting circuit being coupled to the input terminal of the filtering circuit, and an output terminal of the frequency-detecting circuit being coupled to a control terminal of the adjustable resistance device;

wherein the first voltage signal is generated by the frequency-detecting circuit based on the frequency of the first clock signal, the control terminal of the adjustable resistance device is configured to input the first voltage signal, and the on-resistance of the adjustable resistance device changes in response to a voltage value of the first voltage signal changing.

14. The DCC according to claim 13, wherein the less a frequency of the to-be-detected clock signal is, the greater the on-resistance of the adjustable resistance device is.

15. The DCC according to claim 13, wherein a relationship between a signal $V_{in}$ output by the filtering circuit and a signal $V_{out}$ of the input terminal of the DC bias amplifying circuit satisfies a formula:

$$V_{out}=R_{out}/R_{in}+R_{out}\times V_{in};$$

wherein $R_{in}$ is the on-resistance of the adjustable resistance device, and $R_{out}$ is a total resistance of N numbers of resistors $R_0$ connected in series in the DC bias amplifying circuit.

16. The DCC according to claim 13, wherein the adjustable resistance device comprises:

an nMOS transistor, a first terminal of the nMOS transistor being coupled to the output terminal of the filtering circuit, a second terminal of the nMOS transistor being coupled to the input terminal of the DC bias amplifying circuit, and a control terminal of the nMOS transistor being coupled to the output terminal of the frequency-detecting circuit; and/or a pMOS transistor, a first terminal of the pMOS transistor being coupled to the output terminal of the filtering circuit, a second terminal of the pMOS transistor being coupled to the input terminal of the DC bias amplifying circuit, and a control terminal of the pMOS transistor being coupled to the output terminal of the frequency-detecting circuit.

17. The DCC according to claim 11, wherein the filtering circuit comprises:

a low-pass filtering circuit, comprising:

a first resistor, a first terminal of the first resistor being configured to input the first clock signal; and a fourth capacitor, a first terminal of the fourth capacitor being coupled to a second terminal of the first resistor, and a second terminal of the fourth capacitor being grounded; and a high-pass filtering circuit, comprising:

a fifth capacitor, a first terminal of the fifth capacitor being coupled to the second terminal of the fourth capacitor, and a second terminal of the fifth capacitor being coupled to the input terminal of the DC bias amplifying circuit; and a sixth capacitor, a first terminal of the sixth capacitor being coupled to the second terminal of the fifth capacitor, and a second terminal of the sixth capacitor being grounded.

18. The DCC according to claim 11, wherein the DC bias amplifying circuit comprises:

an inverting unit group, comprising N numbers of inverting units, the N numbers of inverting units being connected in series in sequence, and an input terminal of the first inverting unit in the N numbers of inverting units being coupled to the output terminal of the filtering circuit, an output terminal of the last inverting unit in the N numbers of inverting units being configured to output the second clock signal;

a resistance unit group, comprising N numbers of resistors, the N numbers of resistors being connected in series in sequence, and the resistance unit group and the inverting unit group being connected in parallel; and N−1 numbers of capacitor, a first terminal of each capacitor of the N−1 numbers of capacitors being sequentially coupled between two adjacent resistors of the N numbers of resistors, and a second terminal of the each capacitor of the N−1 numbers of capacitors being grounded;

wherein N is an odd number greater than 3.

19. The DCC according to claim 11, further comprising:

a first buffering unit, an input terminal of the first buffering unit being configured to input the first clock signal, and an output terminal of the first buffering unit being coupled to the input terminal of the filtering circuit; and a second buffering unit, an input terminal of the second buffering unit being coupled to the output terminal of the DC bias amplifying circuit, and an output terminal of the second buffering unit being configured to output the second clock signal.

20. An electronic device, comprising a frequency-detecting circuit, wherein the frequency-detecting circuit comprises:

a control-signal generating circuit, configured to receive a to-be-detected clock signal and generate a first control signal corresponding to the to-be-detected clock signal and a second control signal delayed relative to the first control signal;

a charging and discharging path, coupled to the control-signal generating circuit, and performing a charging process or a discharging process under control of the second control signal, wherein during a period with a pulse width when the second control signal is at a high level, the charging and discharging path performs the discharging process, and the charging and discharging path performs the charging process during another period when the second control signal is at a low level; and a control-voltage generating circuit, coupled to an output terminal of the charging and discharging path and the control-signal generating circuit, and configured to sample values of a voltage of an output terminal of the charging and discharging path before the discharging process during a period with a pulse width when the first control signal is at the high level, to output a corresponding first voltage signal.

* * * * *